United States Patent
Lin et al.

(10) Patent No.: US 6,838,725 B2
(45) Date of Patent: Jan. 4, 2005

(54) STEP-SHAPED FLOATING POLY-SI GATE TO IMPROVE A GATE COUPLING RATIO FOR FLASH MEMORY APPLICATION

(75) Inventors: Chrong-Jung Lin, Hsin-Tien (TW); Shui-Hung Chen, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 9 days.

(21) Appl. No.: 09/726,663

(22) Filed: Nov. 30, 2000

(65) Prior Publication Data

US 2001/0000112 A1 Apr. 5, 2001

Related U.S. Application Data

(62) Division of application No. 09/347,547, filed on Jul. 6, 1999, now Pat. No. 6,225,162.

(51) Int. Cl.[7] .................. H01L 29/06; H01L 29/788; H01L 29/76
(52) U.S. Cl. ................ 257/317; 257/315; 257/320
(58) Field of Search .................. 257/317, 320, 257/314–316

(56) References Cited

U.S. PATENT DOCUMENTS

| | | | |
|---|---|---|---|
| 5,243,559 A | * | 9/1993 | Murai .................. 365/185.27 |
| 5,451,537 A | | 9/1995 | Tseng et al. ................ 438/253 |
| 5,464,999 A | | 11/1995 | Bergemont ............ 365/185.16 |
| 5,677,216 A | | 10/1997 | Tseng ......................... 438/259 |
| 5,714,412 A | | 2/1998 | Liang et al. ................ 438/266 |
| 5,801,415 A | | 9/1998 | Lee et al. .................... 257/316 |
| 5,854,502 A | * | 12/1998 | Nishihara ................... 257/321 |
| 5,859,454 A | * | 1/1999 | Choi et al. .................. 257/316 |
| 6,329,688 B1 | * | 12/2001 | Arai ............................ 257/320 |
| 6,445,029 B1 | * | 9/2002 | Lam et al. .................. 257/314 |
| 2001/0045594 A1 | * | 11/2001 | Chang ......................... 257/315 |
| 2002/0096704 A1 | * | 7/2002 | Fukumoto et al. .......... 257/315 |

FOREIGN PATENT DOCUMENTS

JP 01241177 A * 9/1989 ........ 438/FOR 203

* cited by examiner

*Primary Examiner*—Minhloan Tran
*Assistant Examiner*—Thomas L Dickey
(74) *Attorney, Agent, or Firm*—Thomas, Kayden, Horstmeyer & Risley

(57) ABSTRACT

A stacked-gate flash memory cell is provided having step-shaped poly-gates with increased overlap area between them in order to increase the coupling ratio and hence the program speed of the cell. The floating gate is first formed with a step and the intergate dielectric is conformally shaped thereon followed by the forming of the control gate thereon. The increase in the-overlap area can be achieved by forming gates with multiply connected surfaces of different shapes.

4 Claims, 6 Drawing Sheets

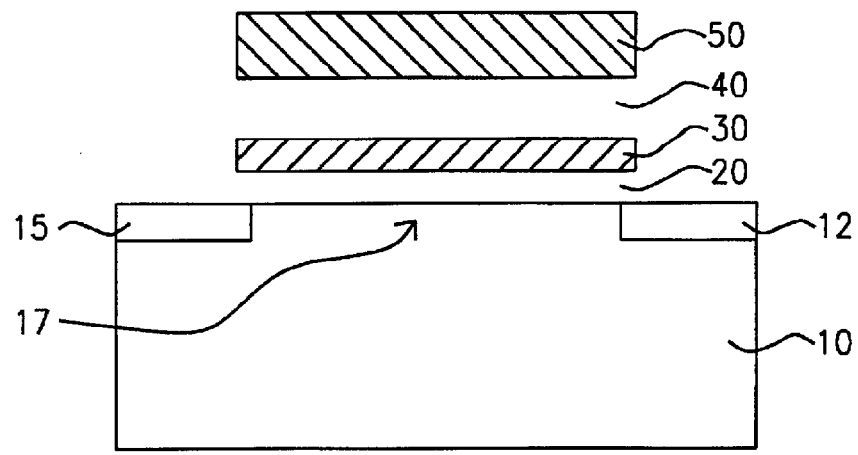
FIG. 1 - Prior Art
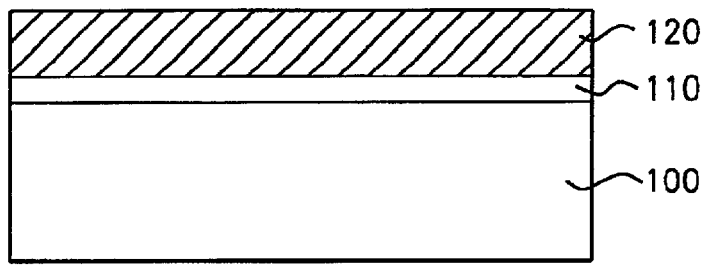
FIG. 2a
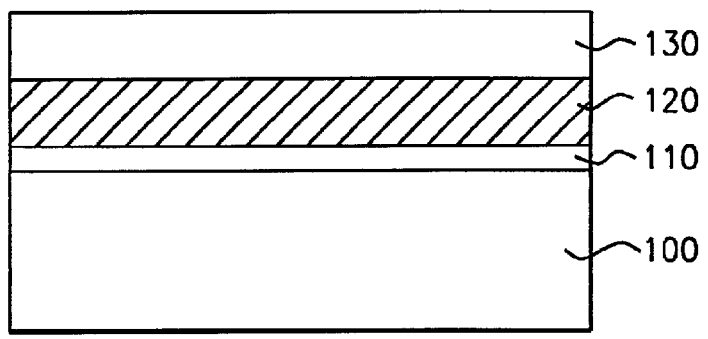
FIG. 2b

STEP-SHAPED FLOATING POLY-SI GATE TO IMPROVE A GATE COUPLING RATIO FOR FLASH MEMORY APPLICATION

This is a division of patent application Ser. No. 09/347,547, filing date Jul. 6, 1999, Step-Shaped Floating Py-Si Gate To Improve Gate Coupling Ratio for Flash Memory Application, now U.S. Pat. No. 6,225,162, assigned to the same assignee as the present invention.

BACKGROUND OF THE INVENTION (1) Field of the Invention

The present invention relates to the manufacturing of semiconductor memories, and in particular, is directed to a stacked-gate flash memory having a step-shaped floating polysilicon gate to improve its program speed, and also to a method of forming the same.

(2) Description of the Related Art

The higher the capacitive coupling between the floating gate and the control gate of a conventional stacked-gate memory cell, the higher is the program speed of the cell, as is well-known in the art. Capacitive coupling can be increased by increasing the capacitance, through an increase in the areas of the floating and control gate electrodes on the contrary, however, because of the continued downscaling in the ultra large scale integration of semiconductor devices in general, the cell area, and hence the areas of the gate electrodes are necessarily being reduced. As a result, it has been difficult to maintain the same coupling levels, let alone increasing them. It is disclosed in the present invention a method of increasing the areas of the gate electrodes, without increasing the cell size, and hence that of the inter-dielectric layer between the gates. The coupling ratio, defined as the ratio of the area of the inter-dielectric layer to the area of the tunnel dielectric layer between the substrate and the floating gate is also increased, yielding a high program and erase speed for the stacked-gate memory cell, as described more fully below.

Although higher coupling ratios between the control gate and the floating gate can be supported by thinner inter-gate dielectric layers, or, inter-polygate oxides, data retention can cause concern due to leakages from thin layers. Also, word line voltages on control gates can be increased to increase programming and erase speeds. But, without the supporting larger area, which is provided in this invention, the situation exacerbates the well-known problem of junction breakdown. It is shown later in the embodiments of this invention that larger areas can be achieved by forming gates with multiply connected surfaces of different shapes.

The importance of data retention capacity and the coupling ratio in a memory cell has been well recognized since the advent of the one-transistor cell memory cell with one capacitor. Over the years, many variations of this simple cell have been advanced for the purposes of shrinking the size of the cell and, at the same time, improving its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMs). Generally, flash EEPROM cells having both functions of electrical programming and erasing may be classified into two categories, namely, a stacked-gate structure and a split-gate structure not discussed here. A conventional stacked-gate type cell is shown in FIG. 1 where, as is well known, tunnel oxide film (20), a floating gate (30), an interpoly insulating film (40) and a control gate (50) are sequentially stacked on a silicon substrate (10) between a drain region (13) and a source region (15) separated by channel region (17). Substrate (10) and channel region (17) are of a first conductivity type, and the first (13) and second (15) doped regions are of a second conductivity type that is opposite the first conductivity type.

The programming and erasing of the flash EEPPOM shown in FIG. 1 is accomplished electrically and in-circuit by using Fowler-Nordheim (F-N) tunneling, as it is known in the art. Basically, a sufficiently high voltage is applied to control gate (50) and drain (13) while source (15) is grounded to create a flow of electrons in channel region (17) in substrate (10). Some of these electrons gain enough energy to transfer from the substrate to control gate (50) through thin gate oxide layer (20) by means of (F-N) tunneling. The tunneling is achieved by raising the voltage level on control gate (50) to a sufficiently high value of about 12 volts. As the electronic charge builds up on floating gate (30), the electric field is reduced, which reduces the electron flow. When, finally, the high voltage is removed, floating gate (30) remains charged to a value larger than the threshold voltage of a logic high that would turn it on. Thus, even when a logic high is applied to the control gate, the EEPROM remains off. Since tunneling process is reversible, floating gate (30) can be erased by grounding control gate (50) and raising the drain voltage, thereby causing the stored charge on the floating gate to flow back to the substrate.

The thicknesses of the various portions of the oxide layers on the stacked-gate flash memory cell of FIG. 1 play an important role in determining such parameters as current consumption, coupling ratio and the memory erase-write speed, especially in an environment where feature sizes in advanced integrated circuits are being scaled down at a rapid rate. In prior art, various methods have been developed to address these parameters. For example, EPROMs having a trench-like coupling capacitors have been disclosed to address the shrinking area of the gate electrodes, and hence the capacitive coupling ratio between the floating gate and control gates on a conventional prior art EPROM. In U.S. Pat. No. 5,801,415, Lee, et al., teach a method for making a such a trench-like coupling capacitor in a non-volatile memory cell from a single filed-effect transistor (FET) that incorporates a floating gate over the FET channel area. The floating gate also extends vertically upward on the sidewalls of the control gate, thereby increasing the capacitor area between the floating and control gates. Tseng of U.S. Pat. No. 5,677,216 also utilizes a trench with a floating gate so as to increase the surface area of the inter-poly in order to achieve a higher coupling ratio.

On the other hand, Tseng uses a different structure in U.S. Pat. No. 5,451,537 in forming a stack capacitor in a dynamic random access memory cell. Here, a bottom electrode is connected to an extends up from the source region of a MOS transistor, and has a top surface with a central cavity, and side surfaces extending down from the top surface in a step-like, or ladder, manner. These step-like sides are formed by a repeated tow-step process of removing a portion of the vertical walls of a photoresist mask and removing a portion of the top surface of a layer of polysilicon from which the bottom electrode, is formed. Still another approach is taught by Liang, et al., in U.S. Pat. No. 5,714,412 for forming a multi-level, split-gate flash memory cell where a control gate spans a pair of floating gate electrodes. A method of programming a flash memory cell is taught by Bergemont of U.S. Pat. No. 5,464,999.

In the present invention, a differently shaped floating gate is disclosed for improving the coupling between the floating gate and control gate of a stacked-gate flash memory cell. The method employed is applicable for increasing the coupling ratio of the well-known Intel ETOX (EPROM with tunnel oxide) memory cell, as shown later in the embodiments of the present invention.

SUMMARY OF THE INVENTION

It is therefore, an object of this invention to provide a stacked-gate flash memory cell having an increased overlap area between the floating gate and the control gate with the associated increase in the gate coupling ratio for improved programming of the cell.

It is another object ox this invention to provide a method of forming a stacked-gate flash memory cell having a step-shaped floating polysilicon gate in order to increase the gate coupling ratio of the cell.

These objects are accomplished by providing a semiconductor substrate; a floating Poly-Si gate with multiply connected surfaces of different shapes; an interpoly dielectric layer over said floating Poly-Si gate; and a Poly-Si control gate over said inter-poly dielectric layer.

These objects are further accomplished by providing a semiconductor substrate; forming a gate-oxide layer over said substrate; forming a first polysilicon layer over said gate-oxide layer; forming a pad-oxide over said first polysilicon layer; forming a nitride layer over said pad-oxide layer; patterning and forming an opening in said nitride layer to define a floating gate region in said substrate; forming a layer of spacer oxide over said nitride layer including said opening; etching said layer of spacer oxide to form oxide spacers in said opening and to expose said first polysilicon layer in said opening; performing a partial etch of said first polysilicon layer exposed in said opening to form a step-shaped surface on said first polysilicon layer; removing said oxide spacers from said opening; performing a re-oxidation of said first polysilicon layer in said opening to form a layer of poly-oxide over said step-shaped surface on said first polysilicon layer; using said layer of poly-oxide as a mask, etching said layers of nitride, pad-oxide and first polysilicon layer to form a floating Poly-Si gate with said step-shaped surface; forming a step-shaped inter-poly oxide layer over said substrate including said floating Poly-Si gate with said step-shaped surface; forming a second polysilicon layer over said step-shaped inter-poly oxide layer; removing said second polysilicon layer and underlying said inter-poly oxide layer from said substrate, excluding from regions over floating Poly-Si gate, thus forming a Poly-Si control gate having step-shaped surface corresponding to said floating Poly-Si gate with step-shaped surface; and performing ion implantation to form source and drain of said stacked-gate flash memory cell.

BRIEF DESCRIPTION OF THE DRAWINGS

FIG. 1 is a cross-sectional view of a conventional stacked-gate type memory cell of prior art.

FIG. 2a is a cross-sectional view of a semiconductor substrate showing the forming of a gate-oxide layer followed by the forming of a first polysilicon layer, according to this invention.

FIG. 2b is a cross-sectional view of a semiconductor substrate showing the forming of a nitride layer over the first polysilicon layer of FIG. 2a, according to this invention.

DESCRIPTION OF THE PREFERRED EMBODIMENTS

Figure 2C:
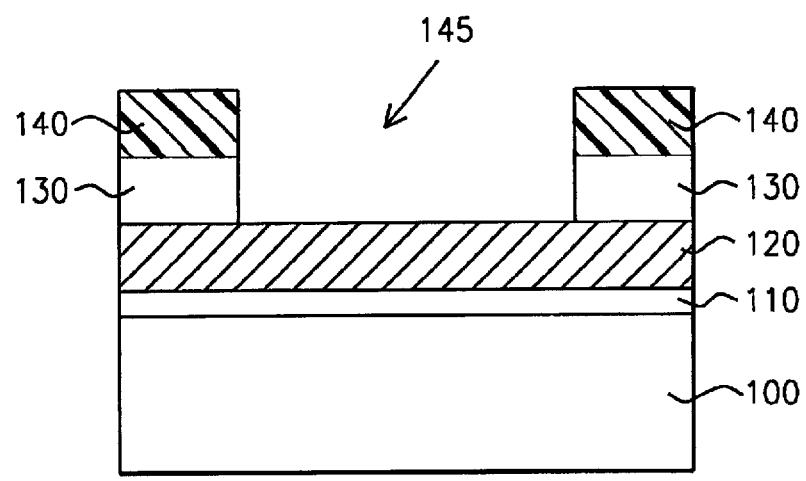
FIG. 2c is a cross-sectional view of a semiconductor substrate showing the patterning of the nitride layer of FIG. 2b, according to this invention.

Referring now to the drawings, specifically to FIGS. 2a–2l, there is shown a preferred method of forming a stacked-gate flash memory cell having a step-shaped floating polysilicon, or, Poly-Si, gate in order to increase the coupling ratio between the floating gate and the control gate of the memory cell. It will become apparent to those skilled in the art that with the disclosure of the one continues rectangular step, other multiply connected surfaces of different shapes can also be formed on the floating gate in order to increase the coupling ratio even more. Such shapes can include triangular, or other nonuniform shapes. It will be evident that the same method disclosed here may be employed in other similar process steps of forming other shapes that are too many to cite here.

In FIG. 2a, a substrate (100), preferably silicon, is shown where a layer of gate oxide (110) is formed thereon. The preferred method of forming the gate oxide is by thermal oxidation in dry oxygen carried out in an oxidation furnace in a temperature range between about 850 to 1000° C. Alternatively, other oxidation methods can be used, such as oxidation in dry oxygen and anhydrous hydrogen chloride in an atmospheric or low pressure environment, or low temperature, high-pressure, and the like.

Next, a first polysilicon layer (120), later to be formed into a floating gate, is deposited over the gate oxide layer. Polysilicon is formed through methods including but not limited to Low Pressure Chemical Vapor Deposition (LPCVD) methods, Chemical Vapor Deposition (CVD)

methods and Physical Vapor Deposition (PVD) sputtering methods employing suitable silicon source materials. Here it is preferred that first polysilicon layer (120) is formed using an LPCVD method employing silane $SiH_4$ as a silicon source material at a temperature range between about 600 to 700° C. It is also preferred that the thickness of first polysilicon layer (120) is between about 1900 to 2100 Å.

Normally, a pad-oxide layer, is next formed over the first polysilicon layer in order to cushion, as is known in the art, the transition of stresses between polysilicon layer (120) and nitride layer (130) to be deposited subsequently. Pad oxide layer may be formed by using chemical CVD $SiO_2$, but it is preferred that it be grown thermally at a temperature range between about 400 to 700° C., and to a thickness between about 500 to 2500 Å. Since silicon nitride (SiN) has similar properties, sometimes a pad-SiN layer alone is formed by reacting dichlorosilane ($SiCl_2H_2$) with ammonia ($NH_3$) in an LPCVD as is shown in FIG. 2b. It is preferred that the thickness of silicon nitride layer (130) is between about 500 to 1500 Å formed at a temperature range between about 600 to 700° C.

Figure 2D:
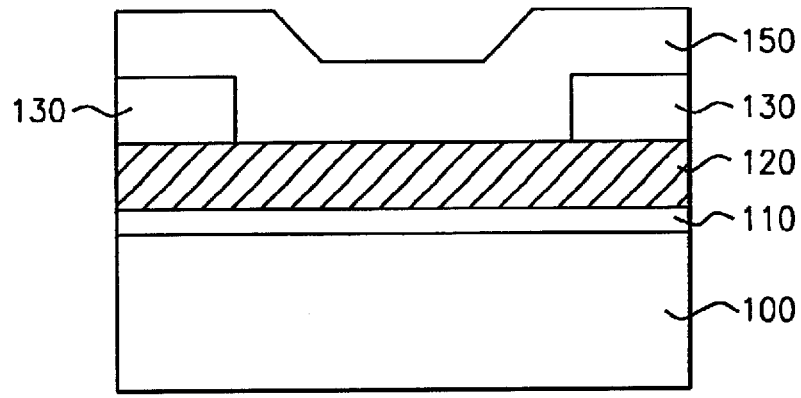
FIG. 2d is a cross-sectional view of a semiconductor substrate showing the forming of a spacer oxide layer over the patterning of FIG. 2c, according to this invention.
Figure 2E:
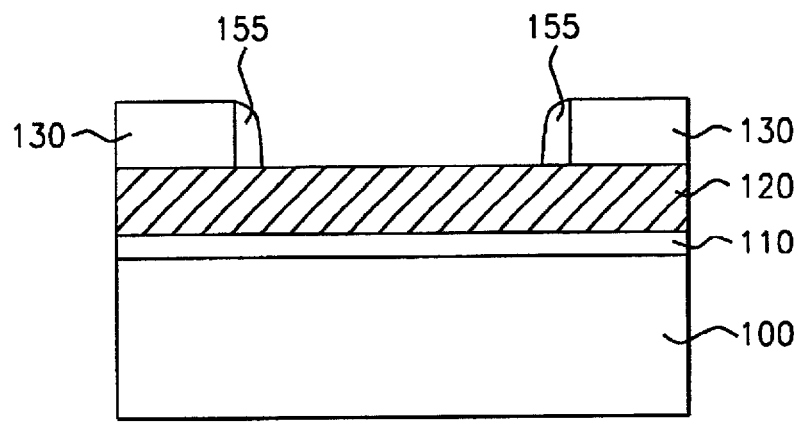
FIG. 2e is a cross-sectional view of a semiconductor substrate showing the forming of oxide spacers, according to this invention.

Then, a first photoresist layer (140) is formed over the nitride layer and patterned to define floating gates to be formed, and the same pattern openings (145) are transferred into the nitride layer as shown in FIG. 2c, by etching. Subsequently, photoresist layer (140) is removed by oxygen plasma ashing and a spacer oxide is formed over the substrate, including the opening (145) as shown in FIG. 2d. It is preferred that the spacer oxide is a TEOS film deposited by the decomposition of tetraethyl orthosilicate at a temperature between about 550 to 700° C. Oxide spacers (155) shown in FIG. 2e are next formed by performing anisotropic etching with gases $CF_4$ or $C_2F_6$.

Figure 2F:
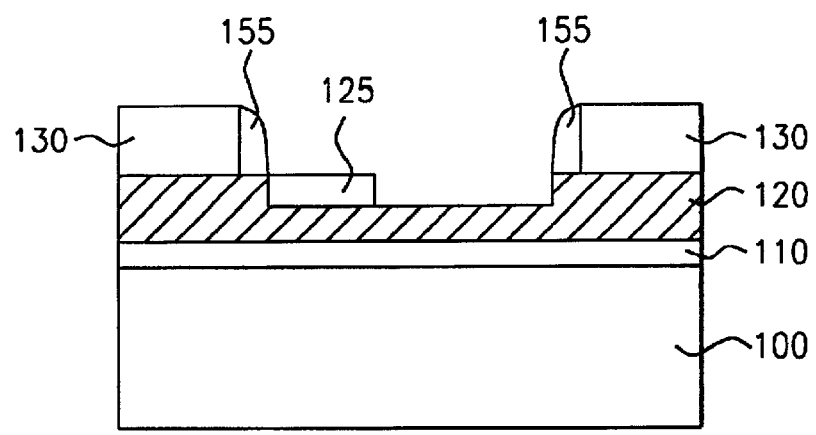
FIG. 2f is a cross-sectional view of a semiconductor substrate showing the forming of a step in the first polysilicon layer of FIG. 2e, according to this invention.

As a main feature and key aspect of the present invention, etching is continued further with gases HBr+$Cl_2$ to form step (125) in first polysilicon layer (120) as shown in FIG. 2f. For a step depth of preferably between about 900 to 1100 Å, the added surface area on the first polysilicon layer is between about 20 to 40% where the higher 40% is preferred. This increase is also reflected in the increased capacitance and therefore in the increased coupling ratio between the floating gate and the control gate to be formed conformally over the floating gate. It will be observed that the top surface of the first polysilicon layer exposed in (125) can be "folded" several times over by having several steps or "fins" similar to that is found in heat sinks. Furthermore, the fins can comprise other shapes, such as triangular, or trapezoidal, and so on, all designed to increase the area of the top surface of the first polysilicon layer (120). As another key step, additional area is gained by removing oxide spacers (155) to expose additional polysilicon areas underneath the spacers, as seen in FIG. 2g.

Figure 2G:
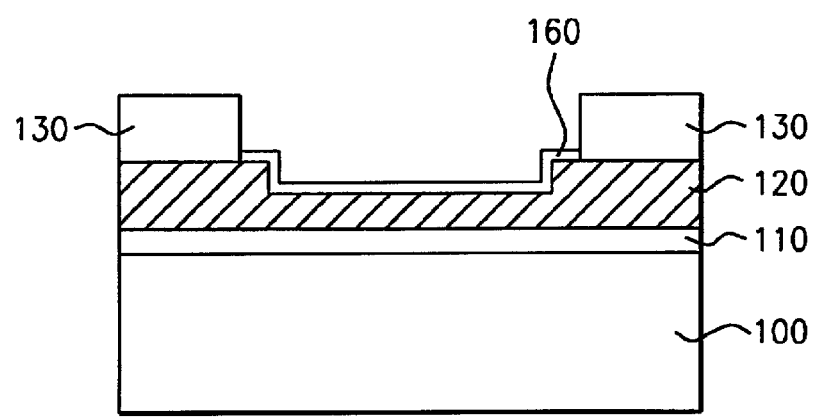
FIG. 2g is a cross-sectional view of a semiconductor substrate showing the oxidation of the first polysilicon layer, according to this invention.
Figure 2H:
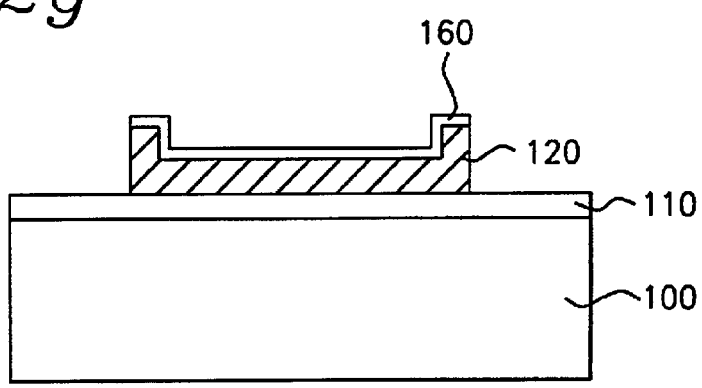
FIG. 2h is a cross-sectional view of a semiconductor substrate showing the forming of the step-shaped floating Poly-Si gate of this invention.
Figure 2I:
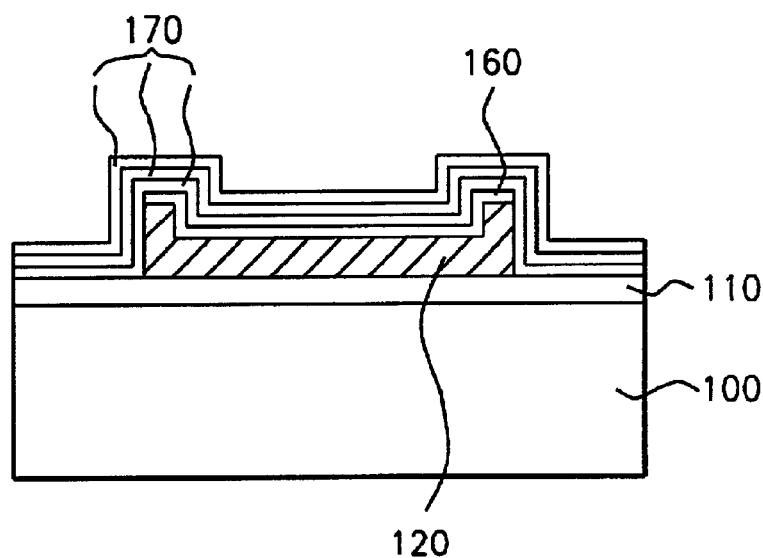
FIG. 2i is a cross-sectional view of a semiconductor substrate showing the forming of a conformal inter-poly oxide over the step-shaped floating Poly-Si gate of this invention.

The first polysilicon layer exposed in the opening in the nitride layer shown in FIG. 2g is next oxidized to form a thin layer of poly-oxide (160) having a thickness between about 100 to 300 Å. The wet oxidation is performed at a temperature between about 850 to 1000° C. Subsequently, using poly-oxide layer (160) as a hard-mask, nitride layer (130) and first polysilicon layer (110) are removed by etching as shown in FIG. 2h to form a floating Poly-Si gate. This is followed by forming a conformal layer such as tantalum oxide ($Ta_2O_5$) or oxide-nitride-oxide (ONO) as shown in FIG. 2i. ONO layer (170) is a re-oxidized nitrated oxide, or an oxynitride, where the latter is formed by the nitridization of a thermal oxide layer by thermally annealing the oxide layer with dilute $NH_3$ using $N_2$ or Ar as a carrier gas at an elevated temperature usually greater than 800° C. It is preferred that carrier gas $N_2$ is used at a temperature between about 600 to 700° C. It will be noted that ONO layer (170) so formed is conformal over the step-shaped floating Poly-Si gate as seen in FIG. 2i, and it serves as an inter-poly, or, inter-gate, dielectric layer between the step-shaped floating gate and the control gate to be formed.

Figure 2J:
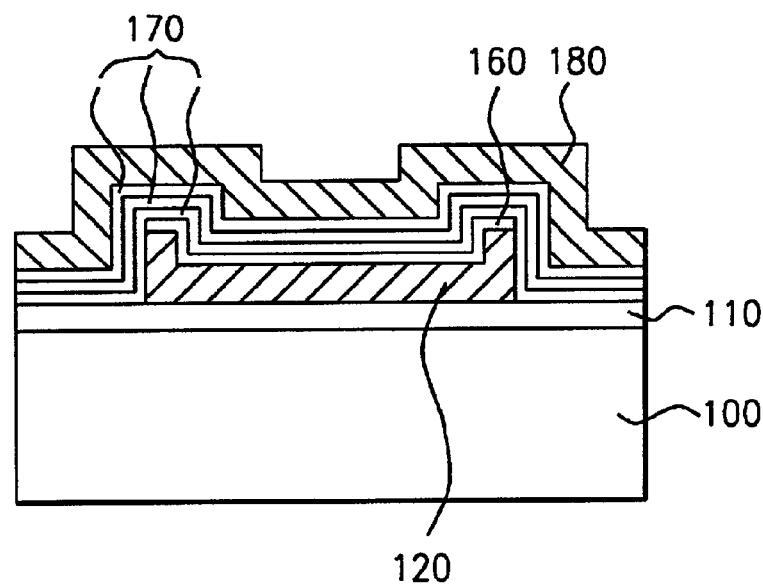
FIG. 2j is a cross-sectional view of a semiconductor substrate showing the forming of a conformal second polysilicon layer over the inter-poly oxide layer of this invention.
Figure 2K:
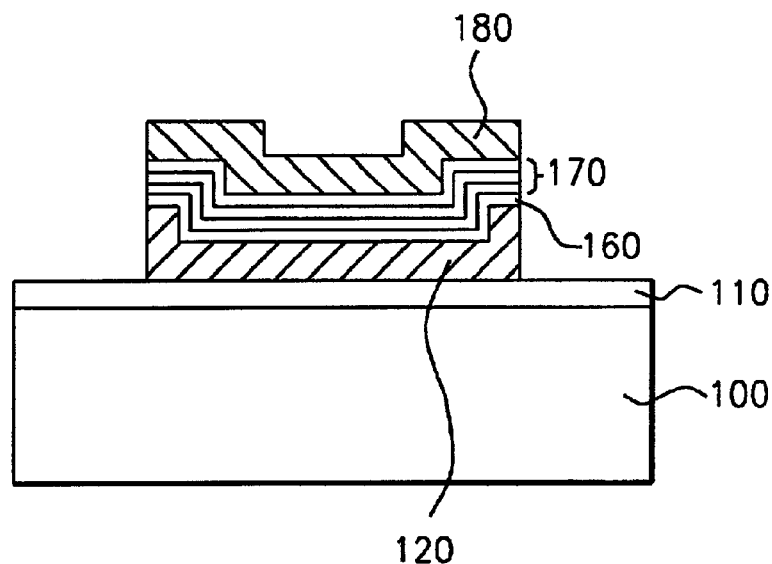
FIG. 2k is a cross-sectional view of a semiconductor substrate showing the forming of the step-shaped control Poly-Si gate of this invention.
Figure 2L:
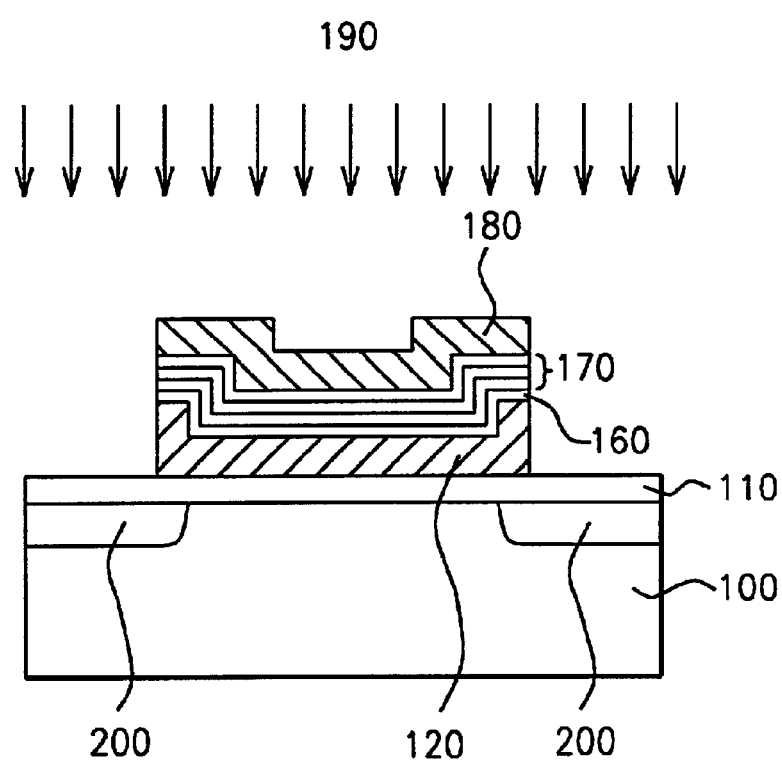
FIG. 2l is a cross-sectional view of a semiconductor substrate showing the ion implanting of the drain and source regions of the step-shaped stacked-gate flash memory cell of this invention.

The control gate of the present invention is also formed conformably by forming a second polysilicon layer over the step-shaped inter-poly ONO layer (170), as shown in FIG. 2j. Preferably, the thickness of second polysilicon layer (180) is between about 1500 to 2000 Å, and is formed by using an LPCVD method employing silane $SiH_4$ as a silicon source material at a temperature range between about 600 to 700° C. The control gate, as seen in FIG. 2k, is then patterned using a second photoresist layer (not shown). The completion of the stacked-gate flash memory cell of the present invention is accomplished by performing a gate self-aligned source/drain implantation of phosphorous/arsenic ions (190) shown in FIG. 2l at a dosage level between about $5 \times 10^{14}$ to $2 \times 10^{15}$ atoms/cm$^2$ and an energy level between about 25 to 45 KeV.

Figure 2M:
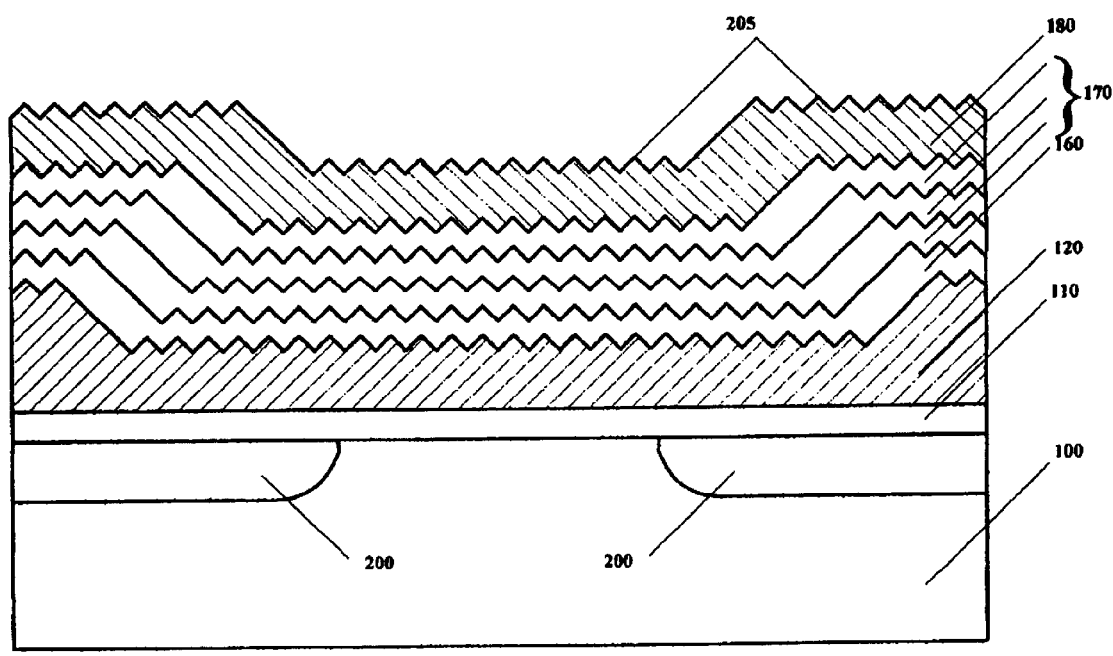
FIG. 2m is a cross-sectional view of a semiconductor substrate showing the triangular cross-section of conformally multiply connected surfaces of the floating gate, inter-gate oxide and the control gate, according to the present invention.

The process steps shown in FIGS. 2a–2l are also applicable to other surfaces of different shapes, as stated previously. FIG. 2m shows the application to "folded" surfaces having regions with triangular cross-sections. Regions with other cross-sections can also be formed, as well as a combination may be achieved through alternating layers with flat surfaces and folded regions having triangular cross-sections.

Though numerous details of the disclosed method have been set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as the many different multiply connected surfaces of different shapes that can be formed in the manufacture of Poly-Si gates. In other instances, well-known processing steps, such as forming oxide spacers are not described in detail in order not to unnecessarily obscure the present invention.

That is to say, while the invention has been particularly shown and described with reference to the preferred embodiments thereof, it will be understood by those skilled in the art that various changes in form and details may be made without departing from the spirit and scope of the invention.

What is claimed is:

1. A stacked-gate flash memory cell having a floating Poly-Si gate with multiply connected surfaces of individual shapes comprising:

a semiconductor substrate having an active area;

a floating Poly-Si gate with a bottom surface and a multiply connected top surface;

said bottom surface being flat and overlying said active area;

said multiply connected top surface overlying said bottom surface; said multiply connected top surface being defined by multiple regions of individual cross-sectional shapes, wherein the area of said multiply connected top surface overlying said active area is greater than the area of said bottom surface;

wherein said individual cross-sectional shapes are selected from a group consisting of rectangular, trapezoidal and triangular shapes;

a conformal inter-poly dielectric layer replicating said individual cross-sectional shapes over said floating Poly-Si gate; and a conformal Poly-Si control gate replicating said individual cross-sectional shapes over said inter-poly dielectric layer;

wherein said regions of individual cross-sectional shapes have a depth between about 900 to 1000 Å.

2. The stacked-gate flash memory cell of claim 1, wherein said inter-poly dielectric layer is oxide-nitride-oxide having a thickness between about 150 to 250 Å.

3. The stacked-gate flash memory cell of claim 1, wherein said Poly-Si control gate has a thickness between about 1500 Å to 2000 Å.

4. The stacked-gate flash memory cell of claim 1, wherein said floating Poly-Si gate has a thickness between about 1900 Å to 2100 Å.

* * * * *